(12) United States Patent
Tang

(10) Patent No.: US 9,343,537 B2
(45) Date of Patent: May 17, 2016

(54) SPLIT GATE EMBEDDED MEMORY TECHNOLOGY AND MANUFACTURING METHOD THEREOF

(71) Applicant: GLOBALFOUNDRIES Singapore Pte. Ltd., Singapore (SG)

(72) Inventor: Yanzhe Tang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 32 days.

(21) Appl. No.: 14/177,164

(22) Filed: Feb. 10, 2014

(65) Prior Publication Data

US 2015/0228739 A1 Aug. 13, 2015

(51) Int. Cl.
| | |
|---|---|
| *H01L 21/8238* | (2006.01) |
| *H01L 29/423* | (2006.01) |
| *H01L 29/66* | (2006.01) |
| *H01L 27/115* | (2006.01) |

(52) U.S. Cl.
CPC .... *H01L 29/42324* (2013.01); *H01L 27/11546* (2013.01); *H01L 29/42328* (2013.01); *H01L 29/66825* (2013.01)

(58) Field of Classification Search
CPC ............ H01L 27/115; H01L 27/11521; H01L 21/28273; H01L 29/66825; H01L 29/42324
USPC ................... 438/201, 211, 257, 261
See application file for complete search history.

(56) References Cited

U.S. PATENT DOCUMENTS 9,087,913 B2 * 7/2015 Hall ......................... H01L 21/82

* cited by examiner

*Primary Examiner* — Quoc Hoang
(74) *Attorney, Agent, or Firm* — Horizon IP Pte. Ltd.

(57) ABSTRACT

A device and method of forming the device using a split gate embedded memory technology are presented. The device includes two polysilicon layers, one for floating gate poly and the other for logic, HV and stack gate and split gate. An oxide-nitride-oxide process of the manufacturing method results in low reliability risk and good uniformity in the device. Moreover, embodiments of the manufacturing method have good controllability of the profile and critical dimension of select gates in production. Furthermore, there is no need to provide non-volatile memory and high-voltage protection for devices manufactured by embodiments of the manufacturing method of the present disclosure.

20 Claims, 14 Drawing Sheets

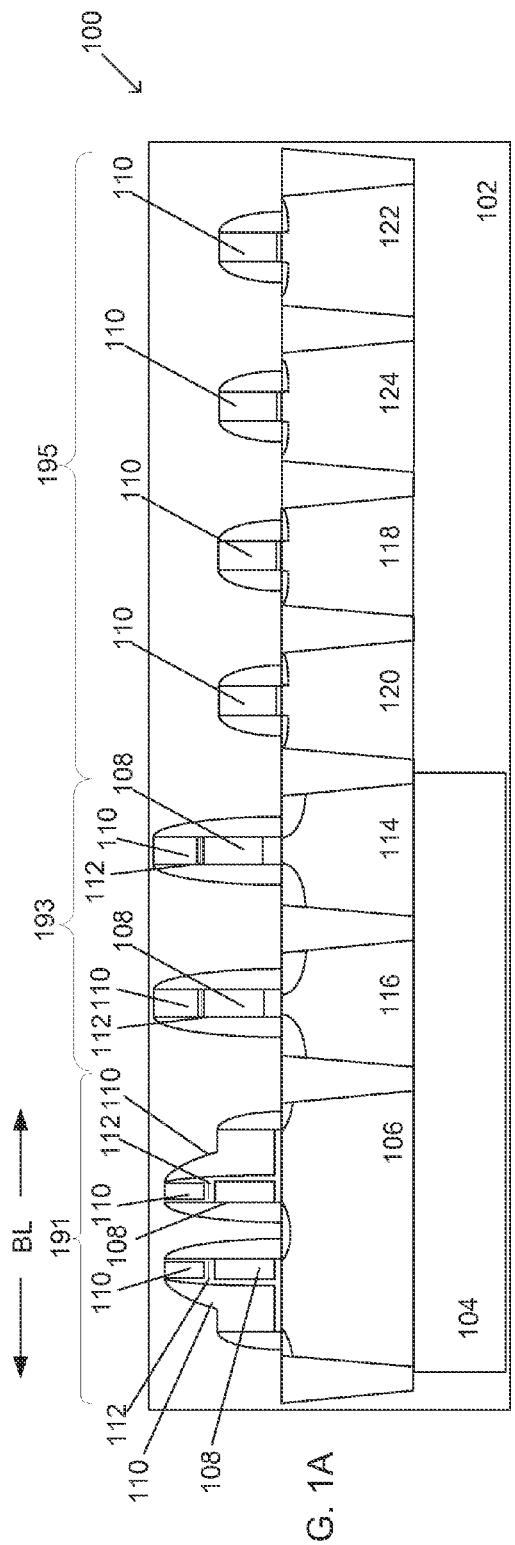
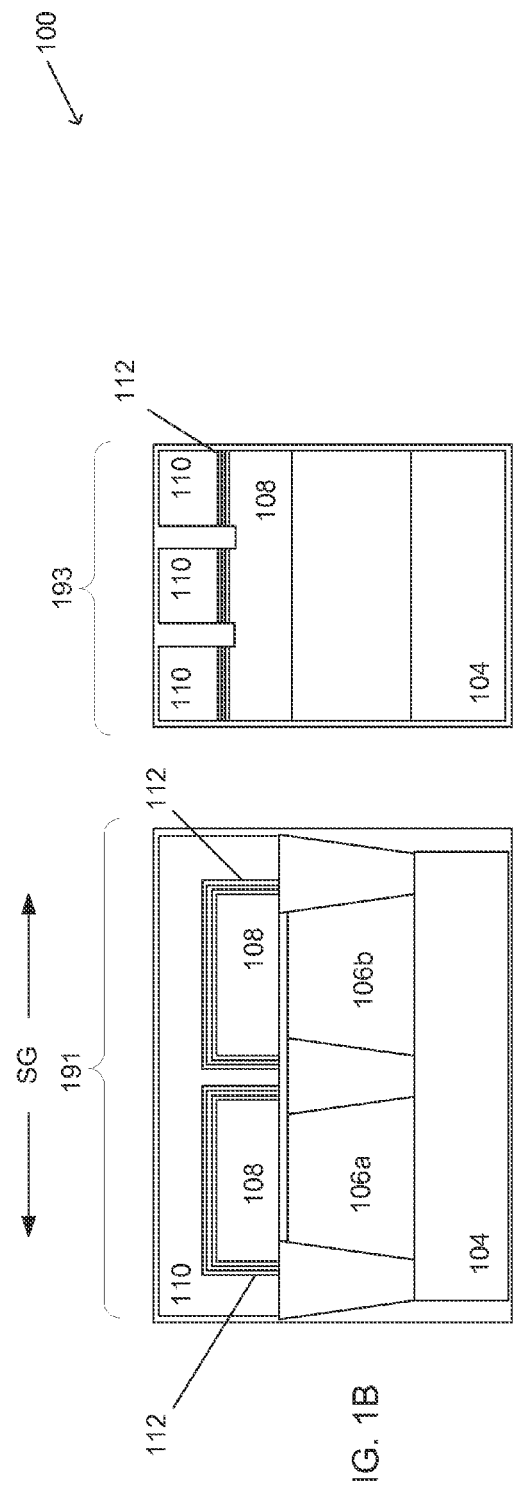

SPLIT GATE EMBEDDED MEMORY TECHNOLOGY AND MANUFACTURING METHOD THEREOF

BACKGROUND

Non-volatile memory devices are in general memory devices that retain, or store, data even when not powered. Presently, non-volatile memory devices are utilized in a wide range of applications including, for example, mobile phones, digital cameras, memory cards, smart cards, and other applications where power is not always available, power is frequently interrupted, or lower power usage is required. Typical non-volatile memory devices include, for example, EPROM (Erasable and Programmable Read Only Memory) devices, EEPROM (Electrically Erasable and Programmable Read Only Memory) devices and flash memory. Split gate memory devices offer a solution which is low cost, re-programmable in system, and highly reliable. Split gate memory device is fabricated and integrated together with other types of devices, such as logic and high voltage (HV) devices, to form embedded memory.

A typical split gate embedded memory technology uses three polysilicon layers (also referred to as poly layers): one for floating gate, one for logic, HV and stack gate, and one for access (split) gate. However, there tend to be a few problems associated with conventional manufacturing method of embedded split gate memory technology. Firstly, during the manufacturing process, the oxide-nitride-oxide (ONO) interpoly layer may be exposed to many logic well photolithography steps. Secondly, complicated processes are required to provide protection for non-volatile memory (NVM) stack and HV devices. Thirdly, the manufacturing process may be unstable and thus results in less-than-ideal yield rate. For example, the profile of select gate of the split gate memory device is sensitive to pattern density which may vary from production to production. Tool situation may vary from run to run while wafer location (wafer to wafer) may also vary.

Accordingly, there remains a need for split gate embedded memory technology that addresses the aforementioned issues, and a manufacturing method thereof.

SUMMARY

In one aspect, an integrated circuit (IC) chip fabricated with split gate embedded memory technology may include a semiconductor substrate and a non-volatile memory array (NVM) region or section having a memory device. The substrate may include a deep well region of a first electrical polarity formed therein. The NVM section may include: a flash well region of a second electrical polarity formed in the substrate and over the deep well region; first and second sections of a first polysilicon layer spaced apart along a bit line direction of the memory device and disposed over the flash well region, each of the first and second sections of the first polysilicon layer configured to function as a floating gate; first and second sections of a second polysilicon layer disposed over the first and second sections of the first polysilicon layer, respectively; third and fourth sections of the second polysilicon layer disposed over the flash well region and adjacent the first section and the second section of the first polysilicon layer, respectively, along the bit line direction; and an interpoly oxide layer disposed between the first polysilicon layer and the second polysilicon layer.

In at least one embodiment, the third section of the second polysilicon layer may be adjacent the first section of the second polysilicon layer and the first section of the first polysilicon layer on a first side of the first section of the second polysilicon layer and the first section of the first polysilicon layer opposite a second side thereof.

In at least one embodiment, the interpoly oxide layer may be further disposed between the third section of the second polysilicon layer and the first section of the second polysilicon layer.

In at least one embodiment, the fourth section of the second polysilicon layer may be adjacent the second section of the second polysilicon layer and the second section of the first polysilicon layer on a second side of the second section of the second polysilicon layer and the second section of the first polysilicon layer opposite a first side thereof. The first side of the second section of the second polysilicon layer and the second section of the first polysilicon layer may face the second side of the first section of the second polysilicon layer and the first section of the first polysilicon layer.

In at least one embodiment, the interpoly oxide layer may be further disposed between the fourth section of the second polysilicon layer and the second section of the second polysilicon layer.

In at least one embodiment, the flash well region may include a first flash well region and a second flash well region spaced apart along a select gate direction of the memory device. Each of the first and the second sections of the first polysilicon layer may respectively include first and second subsections each of which disposed on the first flash well region and the second flash well region, respectively.

In at least one embodiment, the IC chip fabricated with the split gate embedded memory technology further includes a high-voltage (HV) device section. The HV device section may include: a first HV well region of the first electrical polarity formed in the substrate and over the deep well region; a second HV well region of the second electrical polarity formed in the substrate, over the deep well region and adjacent the first HV well region, the second HV well region disposed between and spaced apart from the first HV well region and the flash well region; third and fourth sections of the first polysilicon layer disposed over the first HV well region and the second HV well region, respectively; fifth and sixth sections of the second polysilicon layer disposed over the third section and the fourth section of the first polysilicon layer, respectively; and the interpoly oxide layer disposed between the third section of the first polysilicon layer and the fifth section of the second polysilicon layer and between the fourth section of the first polysilicon layer and the sixth section of the second polysilicon layer.

In at least one embodiment, the IC chip fabricated with the split gate embedded memory technology may further include a logic device section. The logic device section may include: a first input/output (IO) well region of the first electrical polarity formed in the substrate; a second IO well region of the second electrical polarity formed in the substrate and adjacent the first IO well region, the second IO well region disposed between and spaced apart from the first IO well region and the first HV well region; and seventh and eighth sections of the second polysilicon layer disposed over the first and the second IO well regions, respectively.

In at least one embodiment, the logic device section may further include: a first core well region of the first electrical polarity formed in the substrate; a second core well region of the second electrical polarity formed in the substrate and adjacent the first core well region, the second core well region disposed between and spaced apart from the first core well region and the first IO well region; and ninth and tenth sections of the second polysilicon layer disposed over the first and the second core well regions, respectively.

In another aspect, a method of manufacturing a device using the split gate embedded memory technology may include: performing a shallow trench isolation operation on a semiconductor substrate; forming a deep well region of a first electrical polarity in the substrate; forming a flash well region of a second electrical polarity in the substrate and over the deep well region as a non-volatile memory (NVM) region; forming a high-voltage (HV) device section in the substrate and over the deep well region; depositing a first polysilicon layer over the flash well region, the first HV well region, and the second HV well region; forming a slit in the first polysilicon layer to separate the first polysilicon layer along a select gate direction of the memory device; depositing a dummy layer over the first polysilicon layer; and patterning the dummy layer to form first and second control gates over the flash well region. The HV device section may include: a first HV well region of the first electrical polarity; and a second HV well region of the second electrical polarity, the second HV well region disposed between and spaced apart from the first HV well region and the flash well region of the memory device.

In at least one embodiment, the method may further include: forming a logic device section in the substrate, the logic device section includes: a first input/output (IO) well region of the first electrical polarity; a second IO well region of the second electrical polarity, the second IO well region disposed between and spaced apart from the first IO well region and the first HV well region; a first core well region of the first electrical polarity; and a second core well region of the second electrical polarity, the second core well region disposed between and spaced apart from the first core well region and the first IO well region.

In at least one embodiment, the method may further include: depositing an oxide-nitride-oxide (ONO) layer prior to depositing the dummy layer; and prior to depositing the first polysilicon layer, performing operations including: forming a HV oxidation layer; performing a tunnel oxidation process and removing a portion of the HV oxidation layer over the flash well region; and performing a floating gate oxidation process.

In at least one embodiment, patterning the dummy layer to form the first and second control gates may include forming a spacer on each side of each of the first and second control gates along the select gate (SG) direction.

In at least one embodiment, a width of the spacer on each side of each of the first and second control gates is approximately 150 angstroms.

In at least one embodiment, the method may further include: forming an interpoly oxide spacer on each side of each of the first and second control gates along the SG direction; performing a photolithography and implant process on the IO well regions and the core well regions of the logic device section; performing an etching process on the dummy layer; performing a wet dip operation on the interpoly oxide spacers; performing a select gate oxide rapid thermal oxidation (RTO) process; performing a high-temperature oxidation (HTO) process; and depositing a second polysilicon layer.

In at least one embodiment, the RTO and HTO processes form a select gate oxide having a thickness of approximately 100 angstroms, and the HTO process forms a top oxide layer over the HV device section having a thickness of approximately 50 angstroms.

In at least one embodiment, prior to depositing the second polysilicon layer, the method may further include: performing IO well and oxide etching process; performing core well masking and oxide etching process; and performing an oxidation process to form IO and core device gate oxides.

In at least one embodiment, the method may further include: depositing a hard mask layer over the second polysilicon layer; performing a HV gate masking and etching process to open HV gate contact areas, remove a portion of the hard mask layer that is over the logic device section, and form hard mask spacers adjacent a portion of the second polysilicon layer that is over the NVM section; and performing a source line masking process to expose a first portion of the second polysilicon layer between the first and second control gates and to expose a second portion of the second polysilicon layer over the HV device section.

In at least one embodiment, the method may further include: performing an etching process on the second polysilicon layer and the ONO layer; and performing a polysilicon conductor photolithography and etching process to partially remove portions of the second polysilicon layer over the NVM section and the HV device section, and to remove portions of the first polysilicon layer over the HV device section.

In at least one embodiment, the method may further include: removing the hard mask layer; performing a memory light doped drain and HV light doped drain photolithography and implant process for the NVM section and the HV device section, respectively; and performing a logic light doped drain implant and spacer process for the logic device section.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the present disclosure. In the following description, various embodiments of the present disclosure are described with reference to the following drawings.

FIG. 1A is a cross-sectional view of NVM section along a bit line direction, HV section and logic section of an IC chip fabricated with split gate embedded memory technology in accordance with one embodiment of the present disclosure.

FIG. 1B is a cross-sectional view of a select portion of the NVM section of FIG. 1A along a select gate direction (left) and a cross-sectional view of a select portion of the HV section gate contact area (right) of FIG. 1A.

DETAILED DESCRIPTION

Figure 2:
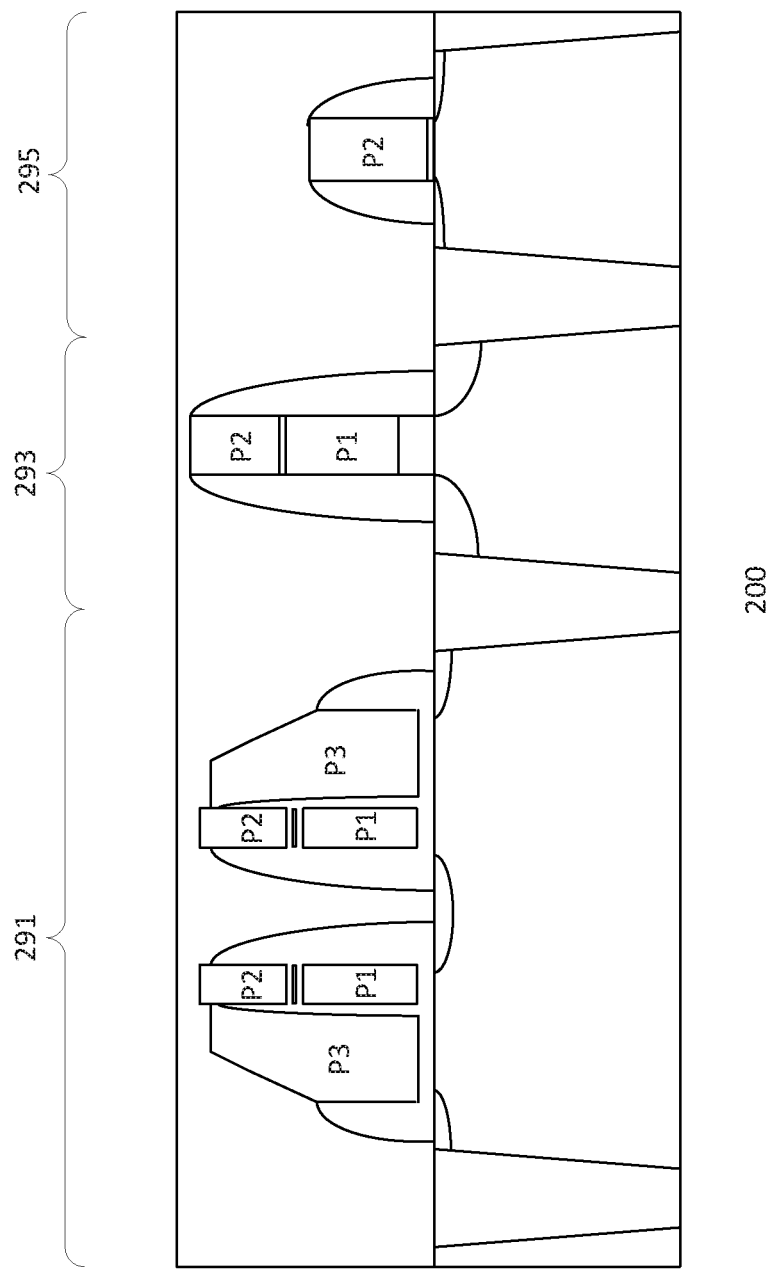
FIG. 2 is a cross-sectional view of NVM section, HV section and logic section of an IC chip fabricated with conventional split gate embedded memory technology.

The present disclosure generally relates to split gate embedded memory devices and a manufacturing method thereof.

FIGS. 1A and 1B, by way of example and not by limitation, depict a portion of a substrate with various device regions processed by a manufacturing process of the present disclosure, as depicted in FIGS. 3-14, for illustrative purpose and are not to be construed as limitation. The device regions, for example, form a portion of an integrated circuit (IC) chip. The portion of the substrate with various device regions is collectively referred to as a device or IC chip 100 herein. It is to be understood that a plurality of conventional processes, that are well known in the art and not repeated herein, may precede or follow the process depicted in FIGS. 3-14. Moreover, it is to be understood that modifications, additions, and/or omissions may be made to the process described below with respect to FIGS. 3-14 without departing from the scope or spirit of the inventive concept of the present disclosure.

FIG. 1A depicts a cross-sectional view of a NVM device section 191 along a bit line (BL) direction, HV device section 193 and logic device section 195 of a portion of an IC chip fabricated with the example split gate embedded memory technology in accordance with one embodiment of the present disclosure while FIG. 1B depicts cross-sectional views of a select portion of the NVM device of FIG. 1A along a select gate (SG) direction (left) and a select portion of the HV device gate contact area (right) of FIG. 1A. Detailed description of the device 100 is provided below with reference to FIGS. 1A and 1B.

The device 100 of the depicted example includes a semiconductor substrate 102 and a non-volatile memory (NVM) region or section 191. The substrate 102 includes a deep well region 104 of a first electrical polarity formed therein (e.g., a deep N well region). The NVM section includes a flash well region 106 of a second electrical polarity formed in the substrate 102 and over the deep well region 104 (e.g., a flash P well); first and second sections of a first polysilicon layer 108 spaced apart along a bit line direction of the device 100 and disposed over the flash well region 106, with each of the first and second sections of the first polysilicon layer 108 configured to function as a floating gate; first and second sections of a second polysilicon layer 110 disposed over the first and second sections of the first polysilicon layer 108, respectively; third and fourth sections of the second polysilicon layer 110 disposed over the flash well region 106 and adjacent the first section and the second section of the first polysilicon layer 108, respectively, along the bit line direction; and an interpoly oxide layer 112 disposed between the first polysilicon layer 108 and the second polysilicon layer 110.

As depicted in FIG. 1A, the third section of the second polysilicon layer 110 is adjacent the first section of the second polysilicon layer 110 and the first section of the first polysilicon layer 108 on a first side of the first section of the second polysilicon layer 110 and the first section of the first polysilicon layer 108 opposite a second side thereof. The interpoly oxide layer 112 is also disposed between the third section of the second polysilicon layer 110 and the first section of the second polysilicon layer 110.

Also as depicted in FIG. 1A, the fourth section of the second polysilicon layer 110 is adjacent the second section of the second polysilicon layer 110 and the second section of the first polysilicon layer 108 on a second side of the second section of the second polysilicon layer 110 and the second section of the first polysilicon layer 108 opposite a first side thereof. The first side of the second section of the second polysilicon layer 110 and the second section of the first polysilicon layer 108 face the second side of the first section of the second polysilicon layer 110 and the first section of the first polysilicon layer 108. The interpoly oxide layer 112 is also disposed between the fourth section of the second polysilicon layer 110 and the second section of the second polysilicon layer 110.

As depicted in FIG. 1B, the flash well region 106 includes a first flash well region 106a and a second flash well region 106b spaced apart along a select gate direction of the memory device 100. Each of the first and the second sections of the first polysilicon layer 108 respectively include first and second subsections each of which disposed on the first flash well region 106a and the second flash well region 106b, respectively.

In at least one embodiment, the device 100 further includes a high-voltage (HV) device section 193. The HV device section includes: a first HV well region 114 of the first electrical polarity (e.g., a HV N well) formed in the substrate 102 and over the deep well region 104; a second HV well region 116 of the second electrical polarity (e.g., a HV P well) formed in the substrate 102, over the deep well region 104 and adjacent the first HV well region 114, with the second HV well region 116 disposed between and spaced apart from the first HV well region 114 and the flash well region 106; third and fourth sections of the first polysilicon layer 108 disposed over the first HV well region 114 and the second HV well region 116, respectively; fifth and sixth sections of the second polysilicon layer 110 disposed over the third section and the fourth section of the first polysilicon layer 108, respectively; and the interpoly oxide layer 112 disposed between the third section of the first polysilicon layer 108 and the fifth section of the second polysilicon layer 110 and between the fourth section of the first polysilicon layer 108 and the sixth section of the second polysilicon layer 110.

Additionally, in at least one embodiment, the device 100 further includes a logic device section 195. The logic device section includes: a first input/output (IO) well region 118 of the first electrical polarity (e.g., an IO N well) formed in the substrate 102; a second IO well region 120 of the second electrical polarity (e.g., an IO P well) formed in the substrate 102 and adjacent the first IO well region 118, with the second IO well region 120 disposed between and spaced apart from the first IO well region 118 and the first HV well region 114; and seventh and eighth sections of the second polysilicon layer 110 disposed over the first and the second IO well regions 118 and 120, respectively.

In at least one embodiment, the logic device section further includes: a first core well region 122 of the first electrical polarity (e.g., a core N well) formed in the substrate 102; a second core well region 124 of the second electrical polarity (e.g., a core P well) formed in the substrate 102 and adjacent the first IO well region 118, with the second core well region 124 disposed between and spaced apart from the first core well region 122 and the first IO well region 118; and ninth and tenth sections of the second polysilicon layer 110 disposed over the first and the second core well regions 122 and 124, respectively.

FIG. 2 is a cross-sectional view of NVM section 291, HV section 293 and logic section 295 of an IC chip or device 200 fabricated with conventional split gate embedded memory technology. The device 200 includes a semiconductor substrate having a non-volatile memory (NVM) region 291, HV device section 293 and logic device section 295. As shown in FIG. 2, the conventional device 200 has three polysilicon layers: layer P1 for floating gate (FG) poly, layer P2 for logic, HV and stack gate, and layer P3 for access (split) gate. In contrast, the device 100 of the present disclosure offers a number of advantages over conventional devices such as the conventional device 200. The oxide-nitride-oxide (ONO) process of the manufacturing method of the present disclosure, as described below, results in low reliability risk and good uniformity in the devices. Moreover, embodiments of the manufacturing method of the present disclosure have good controllability of the profile and critical dimension of select gates in production. The resulting device 100 has two poly layers instead of three. Furthermore, there is no need to provide NVM and HV protection for devices manufactured by embodiments of the manufacturing method of the present disclosure.

FIGS. 3-14 depict an example process 300 of manufacturing the device 100 in accordance with one embodiment of the present disclosure. Detailed description of the example process 300 is provided below with reference to FIGS. 3-14. Example process 300 includes a number of operations, actions, or functions as illustrated in FIGS. 3-14. It would be appreciated by those skilled in the art that, although illustrated as discrete steps, various steps may be divided into additional tasks, combined into fewer steps, or eliminated, depending on the desired implementation. For instance, certain steps well known in the manufacturing of semiconductor devices may be omitted in the following description and/or the figures.

Figure 3:
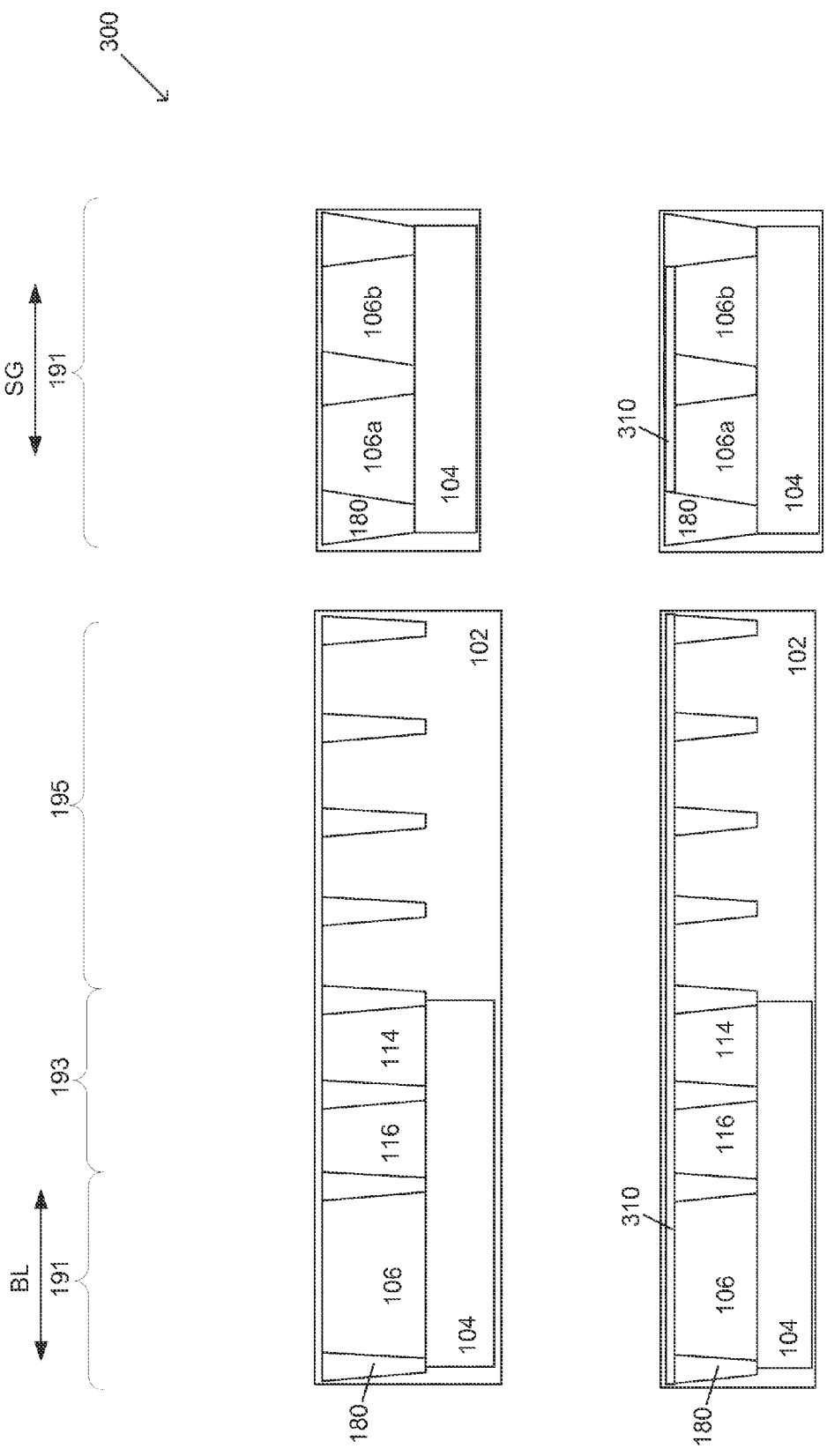
FIG. 3 is a cross-sectional view of a first portion of a manufacturing process of devices for split gate embedded memory technology in accordance with one embodiment of the present disclosure.
Figure 4:
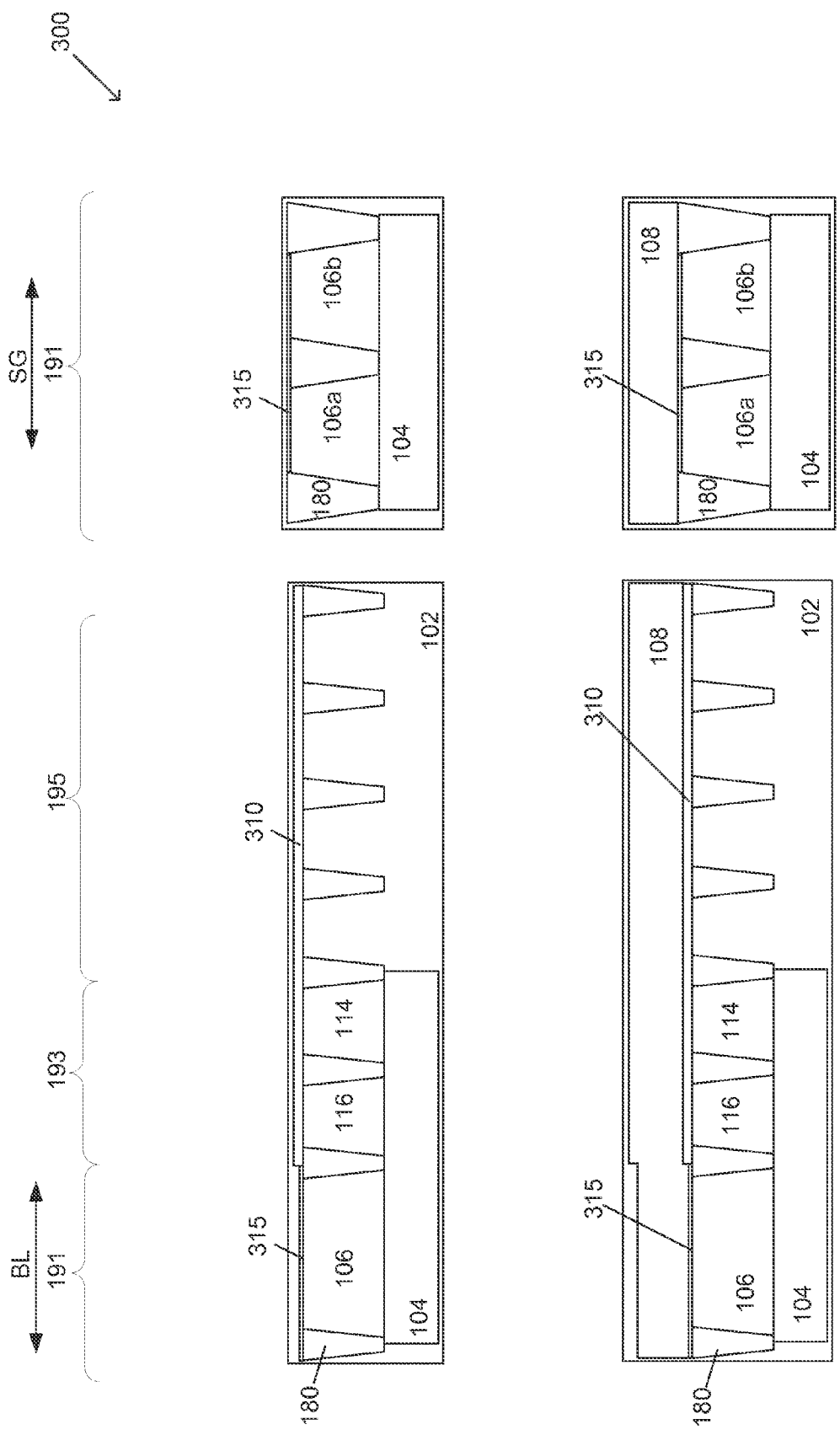
FIG. 4 is a cross-sectional view of a second portion of a manufacturing process of devices for split gate embedded memory technology in accordance with one embodiment of the present disclosure.
Figure 5:
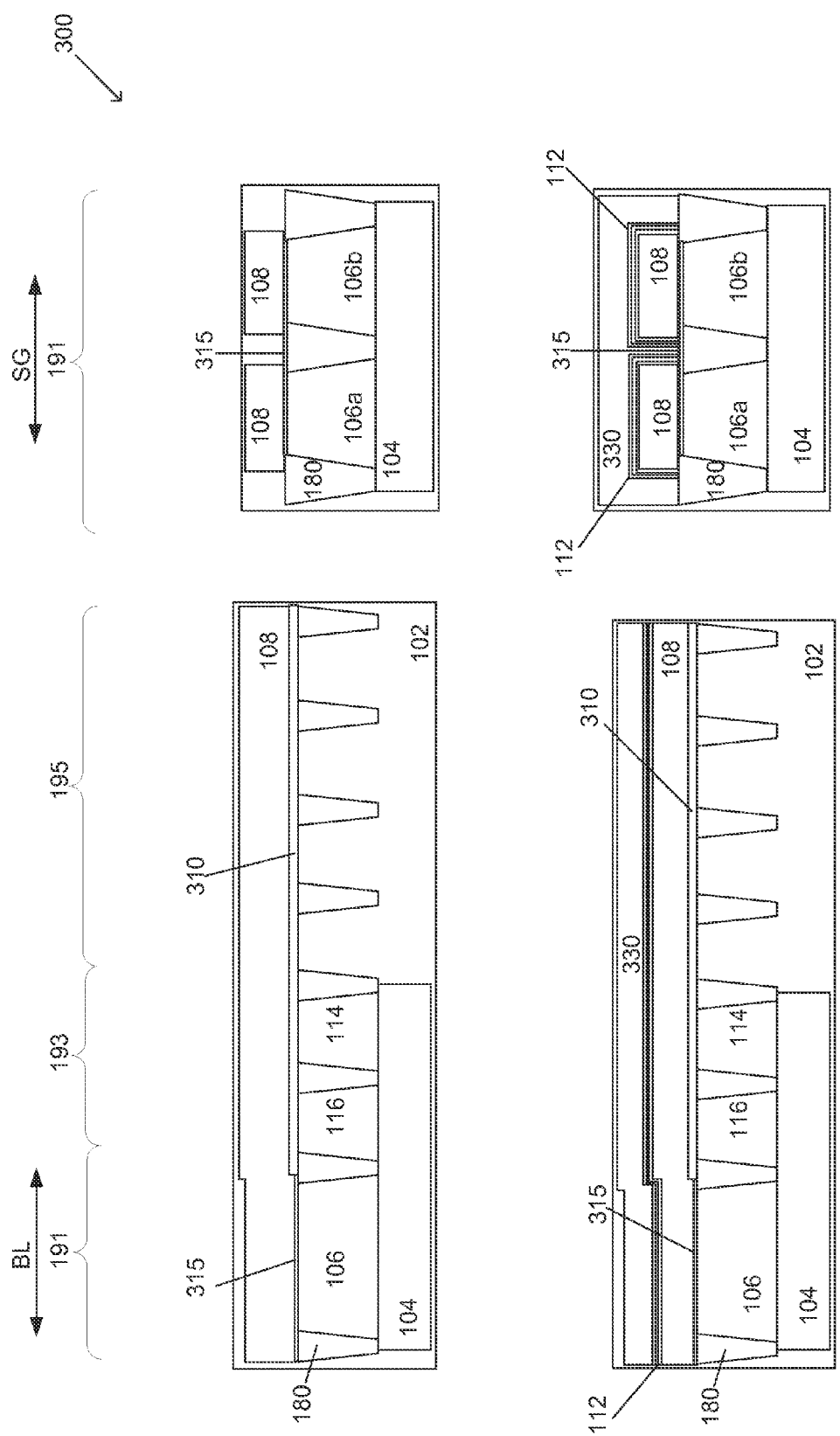
FIG. 5 is a cross-sectional view of a third portion of a manufacturing process of devices for split gate embedded memory technology in accordance with one embodiment of the present disclosure.

As depicted in FIGS. 3-5, example process 300 (e.g., a method of manufacturing of the device 100) includes: performing a shallow trench isolation (STI) 180 operation on a semiconductor substrate 102; forming a deep well region 104 of a first electrical polarity in the substrate; forming a flash well region 106 of a second electrical polarity in the substrate and over the deep well region as a non-volatile memory (NVM) region 191; forming a high-voltage (HV) device section 193 in the substrate and over the deep well region. The HV device section 193 may include: a first HV well region 114 of the first electrical polarity; and a second HV well region 116 of the second electrical polarity, the second HV well region disposed between and spaced apart from the first HV well region and the flash well region along a bit line (BL) direction of the memory device. The deep well, flash well and HV well regions may be formed by implantation processes with suitable dose, dopant types and concentrations.

As shown in FIGS. 3-4, example process 300 performs operations including: forming a HV oxidation layer 310; providing a tunneling oxide mask (not shown) over the HV and logic device sections 193 and 195 and removing a portion of the HV oxidation layer over the flash well region 106; and performing an oxidation process to form a tunneling oxide layer 315 over the flash well region.

The process 300 continues with depositing a first polysilicon layer 108 over the flash well region 106, the first HV well region 114, and the second HV well region 116 and an implantation process may be performed to dope the first polysilicon layer with suitable dopants and concentration; forming a slit in the first polysilicon layer 108 to separate the first polysilicon layer along a select gate (SG) direction of the memory device and depositing a dummy layer 330 over the first polysilicon layer 108 as shown in FIG. 5.

As depicted in FIG. 5, example process 300 further includes: depositing an oxide-nitride-oxide (ONO) layer 112 prior to depositing the dummy layer 330. The dummy layer, for example, includes SiN. Other suitable types of materials may be used as the dummy layer as long as it can be selectively etched with oxide.

Figure 6:
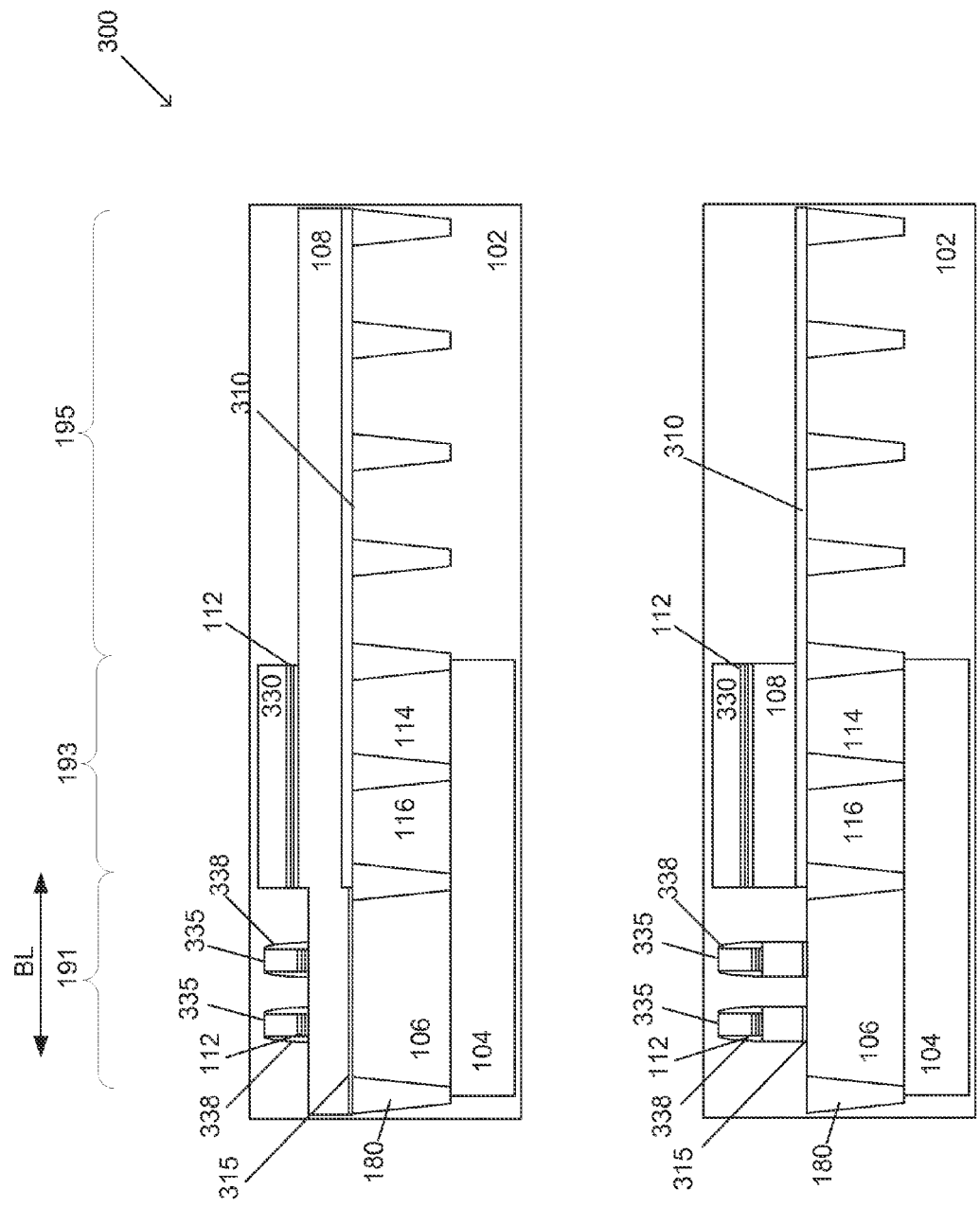
FIG. 6 is a cross-sectional view of a fourth portion of a manufacturing process of devices for split gate embedded memory technology in accordance with one embodiment of the present disclosure.

Referring to FIG. 6, the process continues to pattern the dummy layer 330 to form first and second dummy gates 335 over the flash well region 106. Patterning of the dummy layer to form the dummy gates is performed using suitable mask and etching techniques. As shown in FIG. 6, portions of the dummy and ONO layers not protected by the mask are removed. For example, portions of the dummy and ONO layers over the logic device section 195 are removed. The etch, for example, stops at the top surface of the first polysilicon layer 108. Portions of the dummy and ONO layers over the HV device section remain and serve to protect the underlying portions of the first polysilicon layer during subsequent processing. In at least one embodiment, in patterning the dummy layer 330 to form the first and second dummy gates 335, example process 300 also forms a spacer 338 on each side of each of the first and second dummy gates. The spacers 338, for example, are formed by high temperature oxidation process and a dry etch is performed to remove horizontal portions of the spacer layer, leaving the spacers on the sides of the first and second dummy gates. In at least one embodiment, a width of the spacer on each side of each of the first and second dummy gates is approximately 150 Å. Other suitable width dimensions are also useful.

The process continues to pattern the first polysilicon layer 108. Patterning of the first polysilicon layer is performed using suitable mask and etching technique. As shown in FIG. 6, portions of the first polysilicon layer 108 not covered by the mask is removed. For example, portions of the first polysilicon layer over the logic device region 195 and portions of the first polysilicon layer not protected by the dummy gate over flash well region are removed. The remaining portions of the first polysilicon layer over the NVM region 191 correspond to the floating gates of the NVM device.

Figure 7:
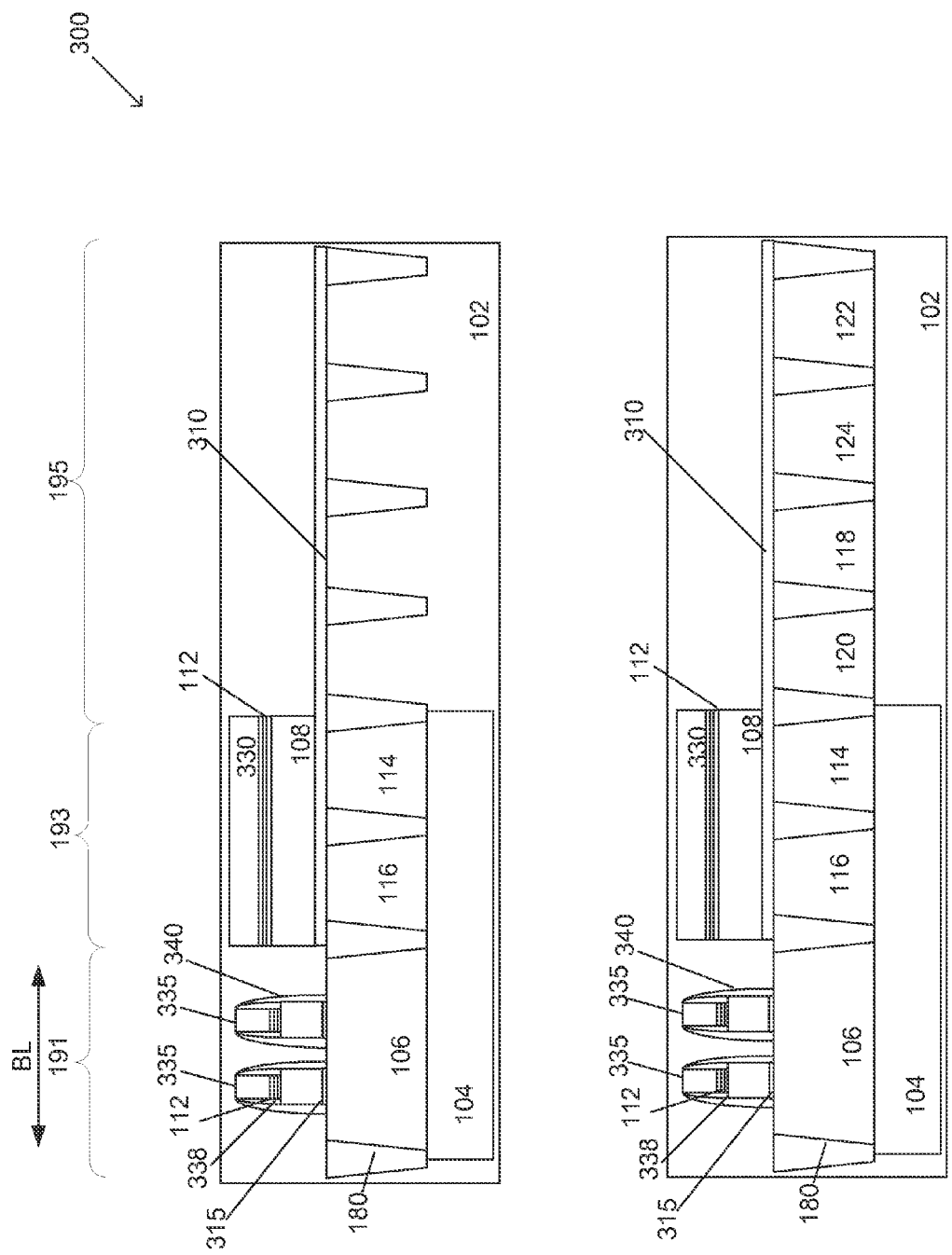
FIG. 7 is a cross-sectional view of a fifth portion of a manufacturing process of devices for split gate embedded memory technology in accordance with one embodiment of the present disclosure.
Figure 8:
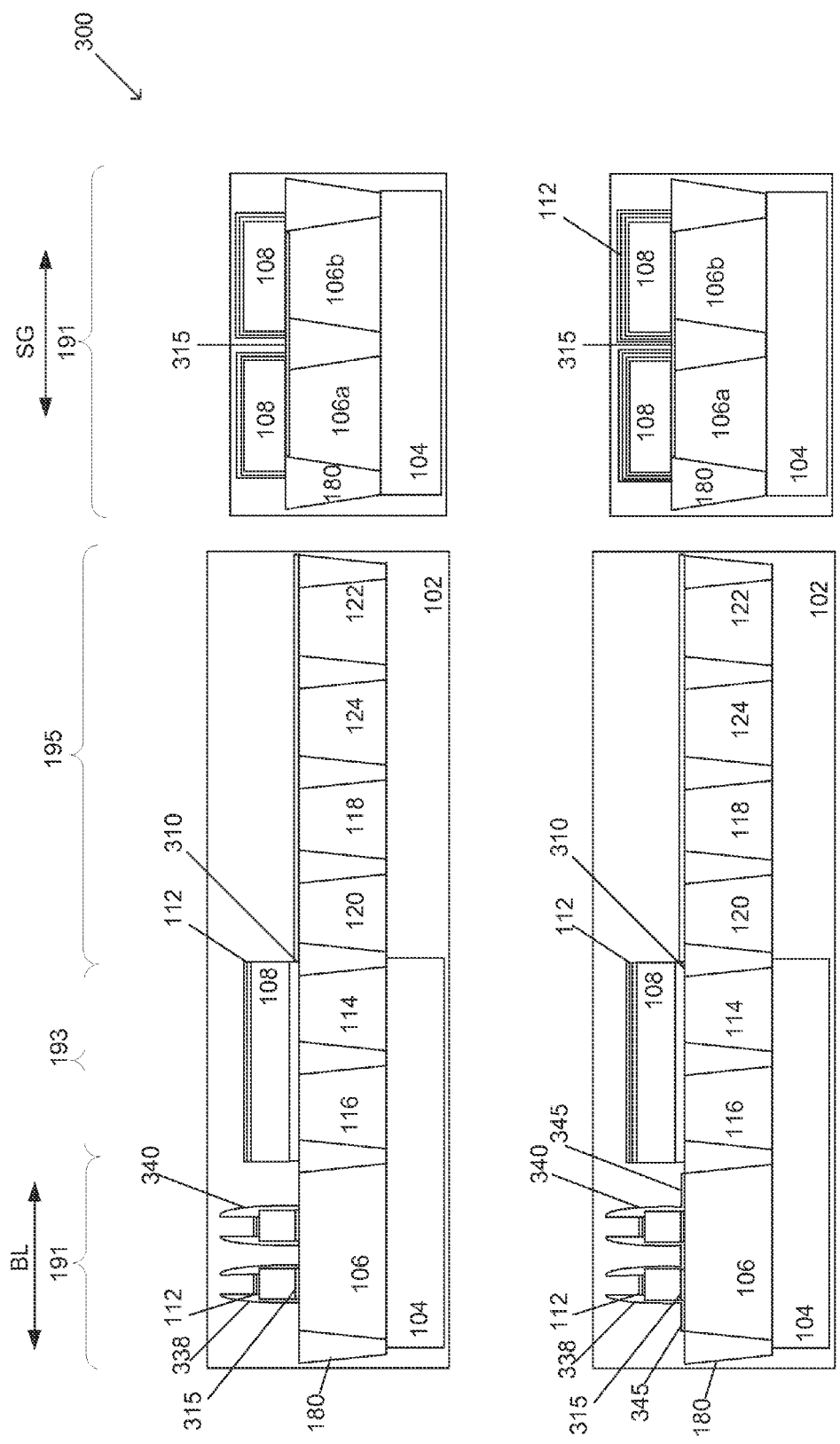
FIG. 8 is a cross-sectional view of a sixth portion of a manufacturing process of devices for split gate embedded memory technology in accordance with one embodiment of the present disclosure.

As depicted in FIGS. 7-8, example process 300 further includes: forming an interpoly oxide spacer 340 on each side of each of the first and second dummy gates 335; performing a photolithography and implant process on the IO well regions and the core well regions of the logic device section; performing an etching process on the dummy layer 330; performing a wet dip operation on the interpoly oxide spacers 340; performing a select gate oxide rapid thermal oxidation (RTO) process; performing a high-temperature oxidation (HTO) process; and depositing a second polysilicon layer 110.

Referring to FIG. 7, interpoly oxide spacers 340 are formed on each side of each of the first and second dummy gates 335 along the bit line direction. To form the interpoly oxide spacers, a spacer layer may be formed over the substrate using high temperature oxidation process and a dry etch is performed to remove horizontal portions of the spacer layer, leaving the interpoly oxide spacers on sides of the first and second dummy gates. The photolithography and implant process in the logic device section 195 to form the IO well regions and the core well regions in the substrate 102 includes: forming a first input/output (IO) well region 118 of the first electrical polarity; a second IO well region 120 of the second electrical polarity, the second IO well region disposed between and spaced apart from the first IO well region and the first HV well region; a first core well region 122 of the first electrical polarity; and a second core well region 124 of the second electrical polarity, the second core well region disposed between and spaced apart from the first core well region and the first IO well region. The IO and core well regions may be formed by implantation processes with suitable dose, dopant types and concentrations.

The process continues by performing an etching process on the dummy layer 330. The etch, as shown in FIG. 8, includes removing the dummy layer 330 over the NVM region 191 and high voltage device section 193. The etch involves suitable etch chemistry and parameters. A wet dip operation process, such as a dilute hydrofluoride (DHF) wet cleaning, is performed. The wet dip process, for example, removes the top oxide layer of the ONO stack 112 without damaging the underlying nitride layer. Other suitable techniques may also be employed to remove the top oxide layer of the ONO stack.

In at least one embodiment, the select gate RTO process may selectively form a first portion of the select gate oxide layer having a thickness of approximately 50 Å over the substrate, and the HTO process may form a second portion of the select gate oxide layer having a thickness of approximately 50 Å over the first portion of the select gate oxide layer. Thus, the total thickness of the select gate oxide layer 345, for example, is about 100 Å. The HTO process, in one embodiment, also forms a top oxide layer over the exposed nitride layer to form the ONO stack 112 over the HV device section 193. The top oxide layer of the ONO stack, for example, is about 50 Å. Other suitable thickness dimensions may also be useful.

Figure 9:
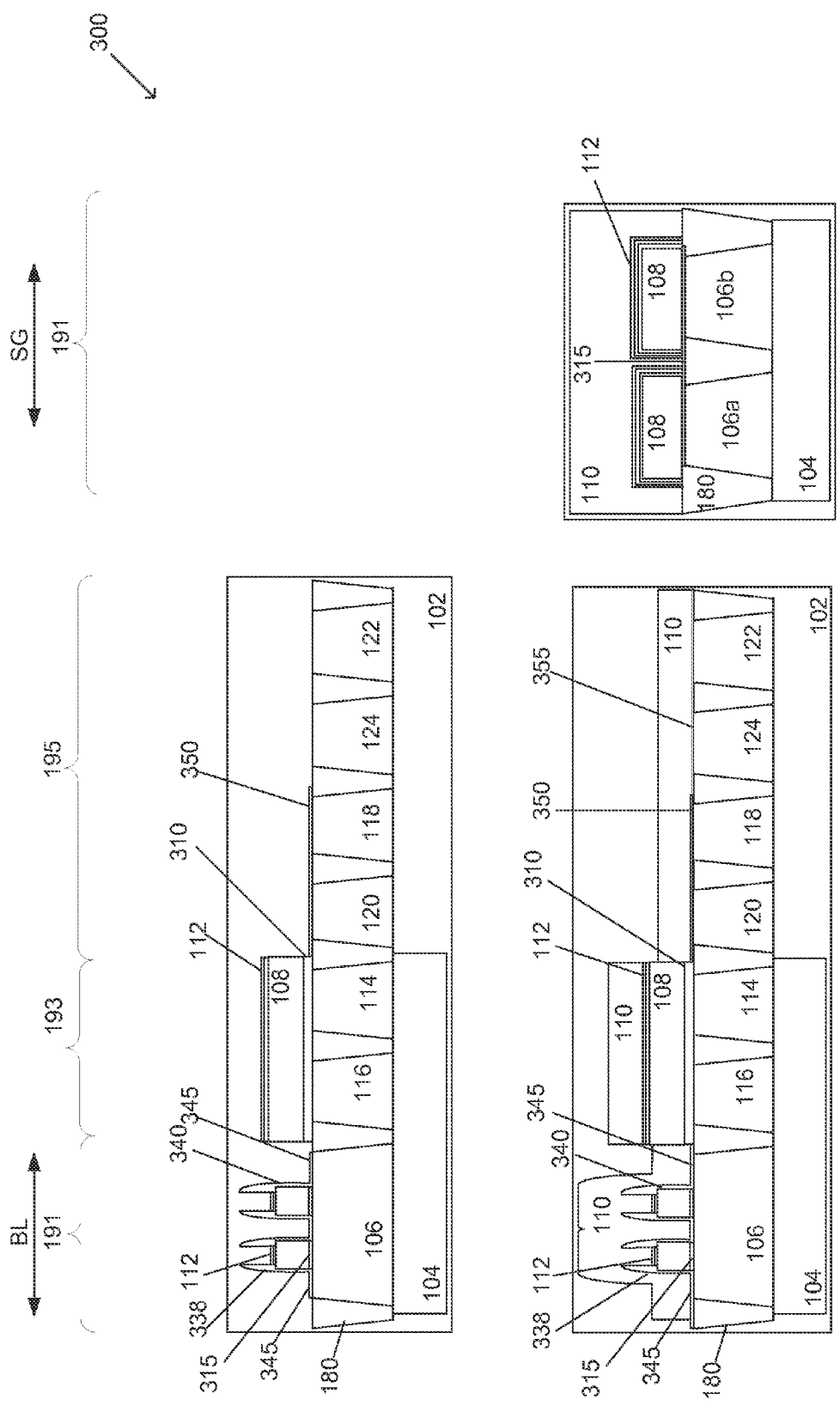
FIG. 9 is a cross-sectional view of a seventh portion of a manufacturing process of devices for split gate embedded memory technology in accordance with one embodiment of the present disclosure.

As depicted in FIG. 9, a second polysilicon layer 110 is deposited. Prior to depositing the second polysilicon layer, example process 300 further includes: performing IO well regions masking and oxide etching process; performing an oxidation process to form the logic IO oxide layer 350; performing core device well masking and oxide etching process. These process steps remove any oxide residues from previous process steps over these regions. Example process 300 also includes performing an oxidation process to form oxide layers over the IO and core well regions to form the IO and core device gate oxide.

Figure 10:
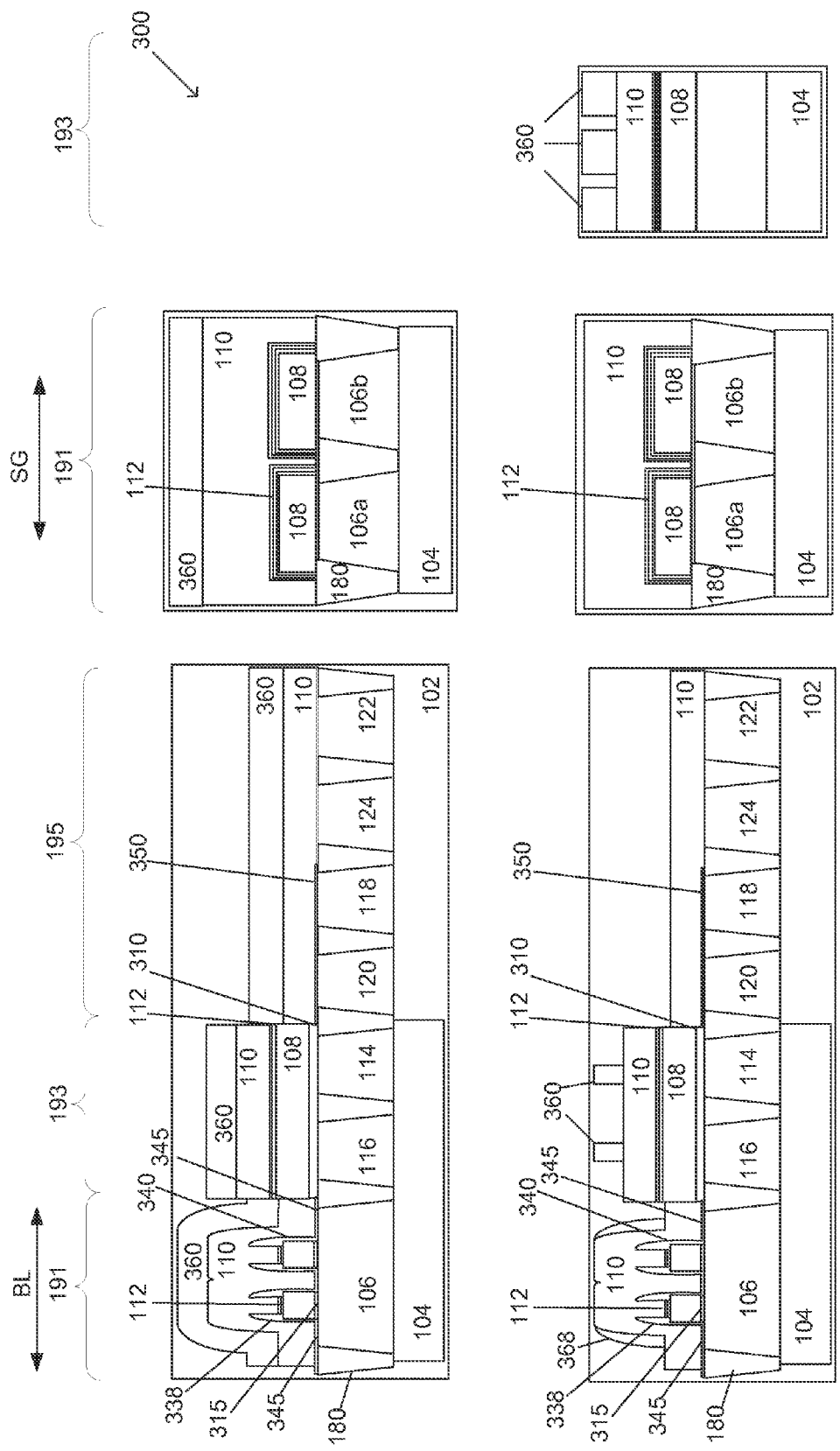
FIG. 10 is a cross-sectional view of an eighth portion of a manufacturing process of devices for split gate embedded memory technology in accordance with one embodiment of the present disclosure.
Figure 11:
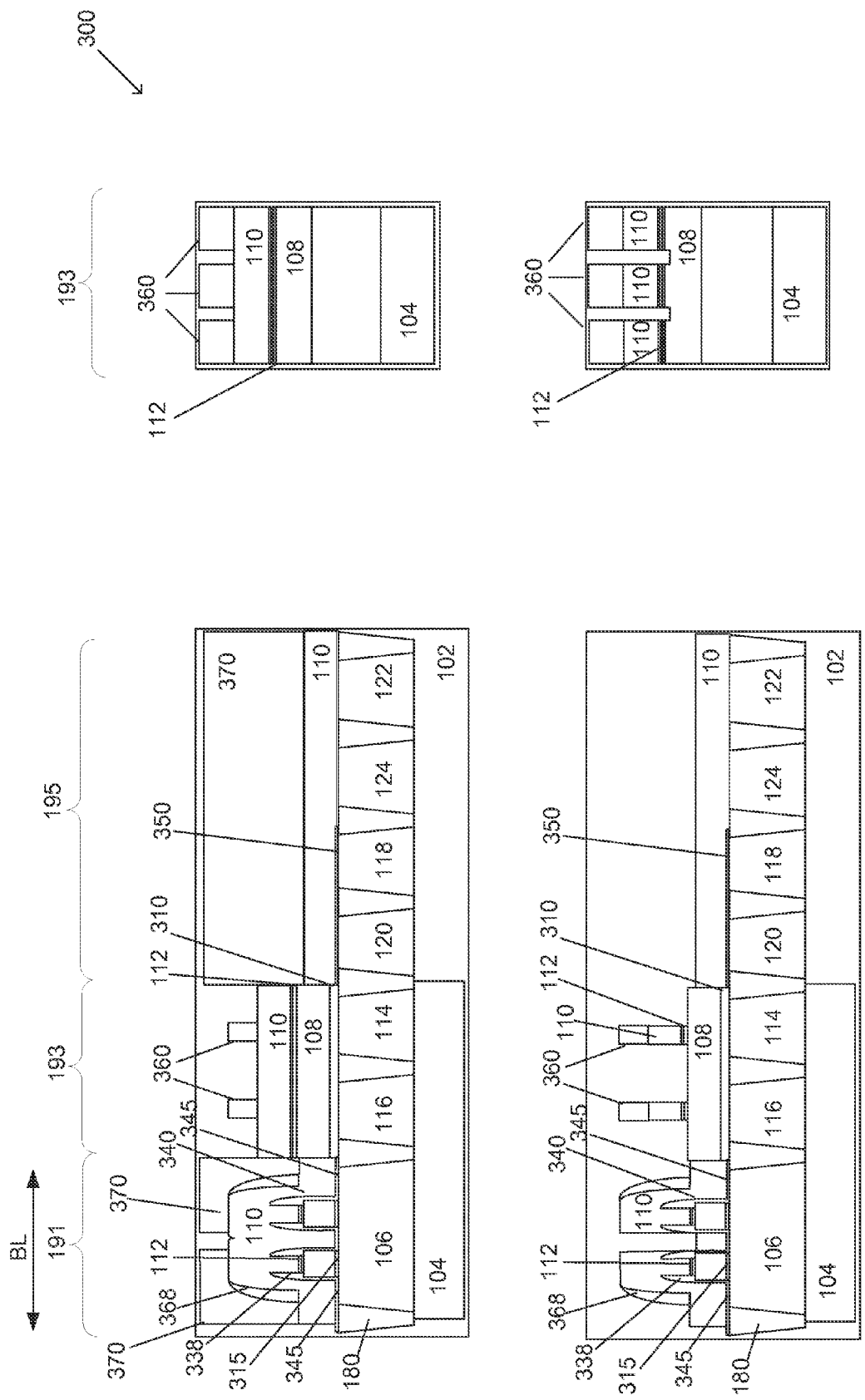
FIG. 11 is a cross-sectional view of a ninth portion of a manufacturing process of devices for split gate embedded memory technology in accordance with one embodiment of the present disclosure.

As depicted in FIGS. 10-11, example process 300 further includes: depositing a hard mask layer 360, such as but not limited to SiN, over the second polysilicon layer 110. Other suitable materials may also be used as the hard mask. The thickness of the hard mask layer, for example, depends on the length of the select gate. The process continues by performing a HV gate masking and hard mask etching process to open HV gate contact areas, remove a portion of the hard mask layer that is over the logic device section 195, and form hard mask spacers 368 adjacent a portion of the second polysilicon layer that is over the NVM section 191; and performing a source line masking process by providing a mask 370 over portions of the NVM region 191 and logic device section 195 while exposing a first portion of the second polysilicon layer 110 between the first and second control gates and exposing a second portion of the second polysilicon layer 110 over the HV device section 190.

Figure 12:
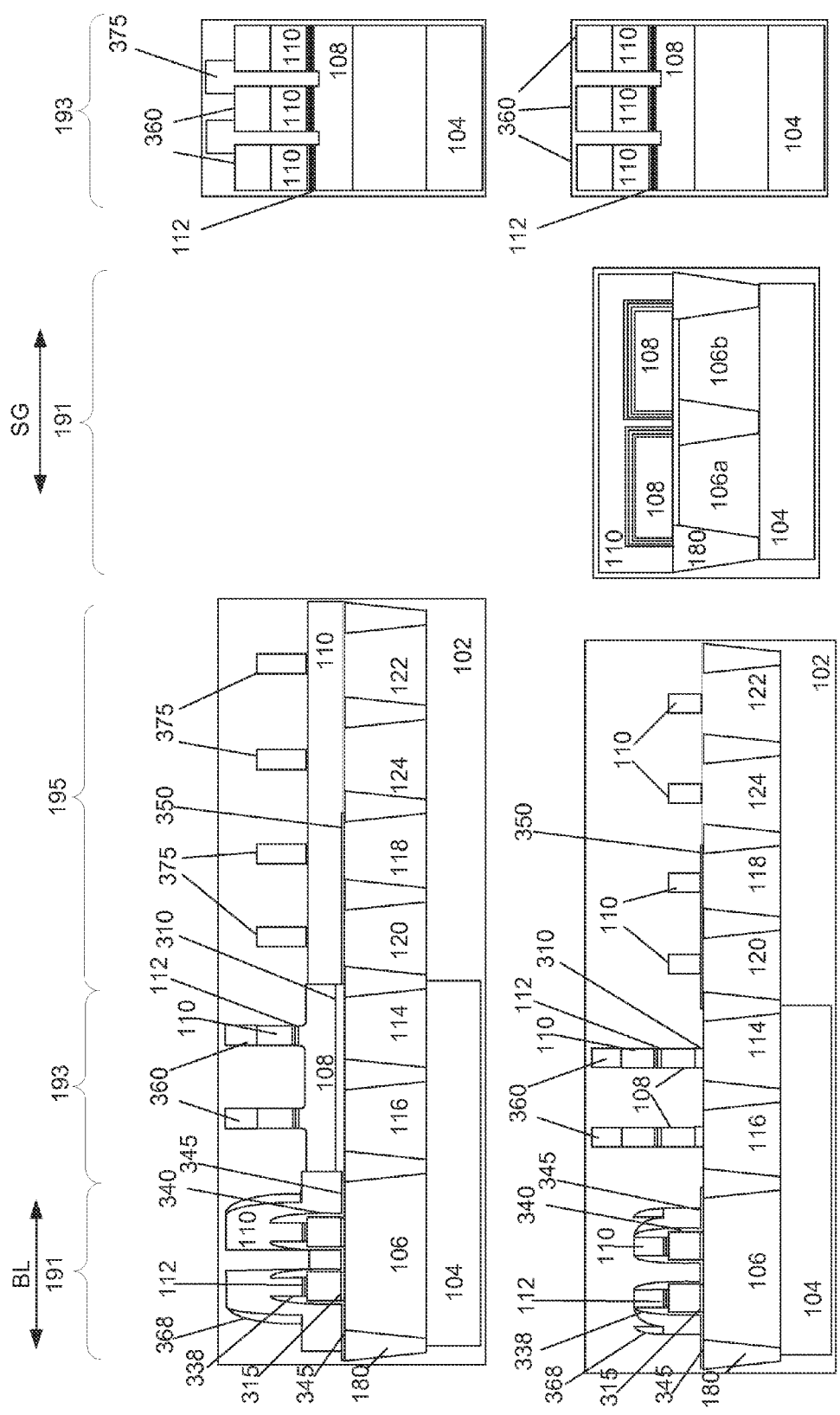
FIG. 12 is a cross-sectional view of a tenth portion of a manufacturing process of devices for split gate embedded memory technology in accordance with one embodiment of the present disclosure.

As depicted in FIGS. 11-12, example process 300 further includes: performing an etching process on the second polysilicon layer 110 and the ONO layer 112; and performing a polysilicon conductor photolithography and etching process to partially remove portions of the second polysilicon layer 110 over the NVM section 191 and the HV device section 193, where the etch stops at the top surface of the first polysilicon layer 108; and to remove portions of the first polysilicon layer 108 over the HV device section 193. The process continues by performing a photolithography and etching process to form the logic gates. For example, patterned logic gate mask 375 is deposited on the second polysilicon layer 110 over the logic device section 195 to form logic gates. The exposed portions of the second polysilicon layer 110 are removed by an etching process. The patterned logic gate mask 375 also blocks HV gate contact areas, as shown on the top right of FIG. 12. The remaining portions of the first polysilicon layer 108 over the HV device section 193 correspond to the HV gate while the remaining portions of the second polysilicon layer 110 over the logic device section correspond to the logic gates and the remaining portions of the second polysilicon layer 110 over the NVM region 191 correspond to the control gate and select gate, respectively. As shown, the hard mask spacers 368 protects the underlying portion of the second polysilicon layer 110, enabling stable select gate critical dimension (CD) and profile to be achieved. Without the hard mask or the hard mask spacers 368, the second polysilicon layer 110 adjacent the spacer 338 may be overetched, resulting in non-stable select gate CD and profile.

Figure 13:
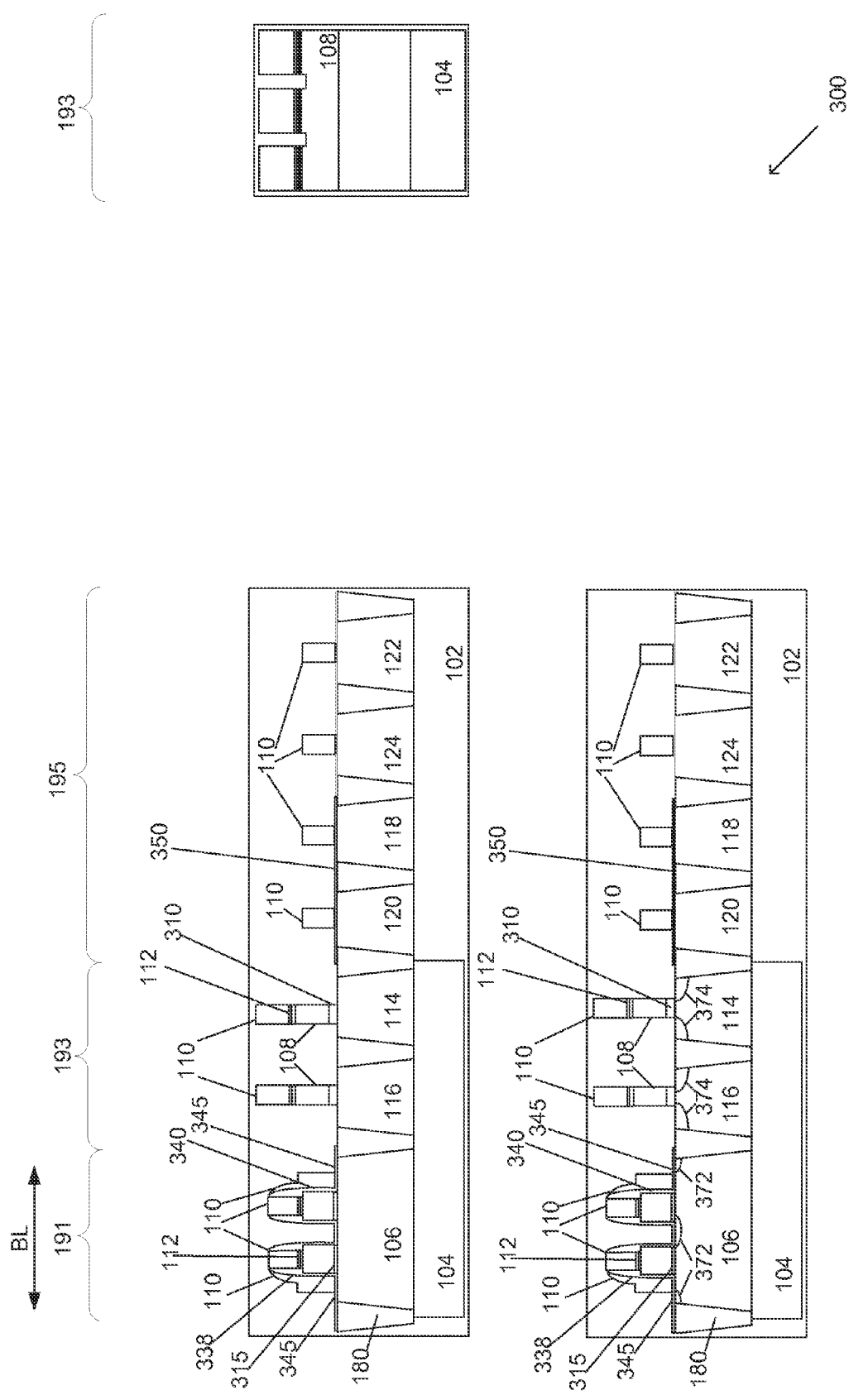
FIG. 13 is a cross-sectional view of an eleventh portion of a manufacturing process of devices for split gate embedded memory technology in accordance with one embodiment of the present disclosure.
Figure 14:
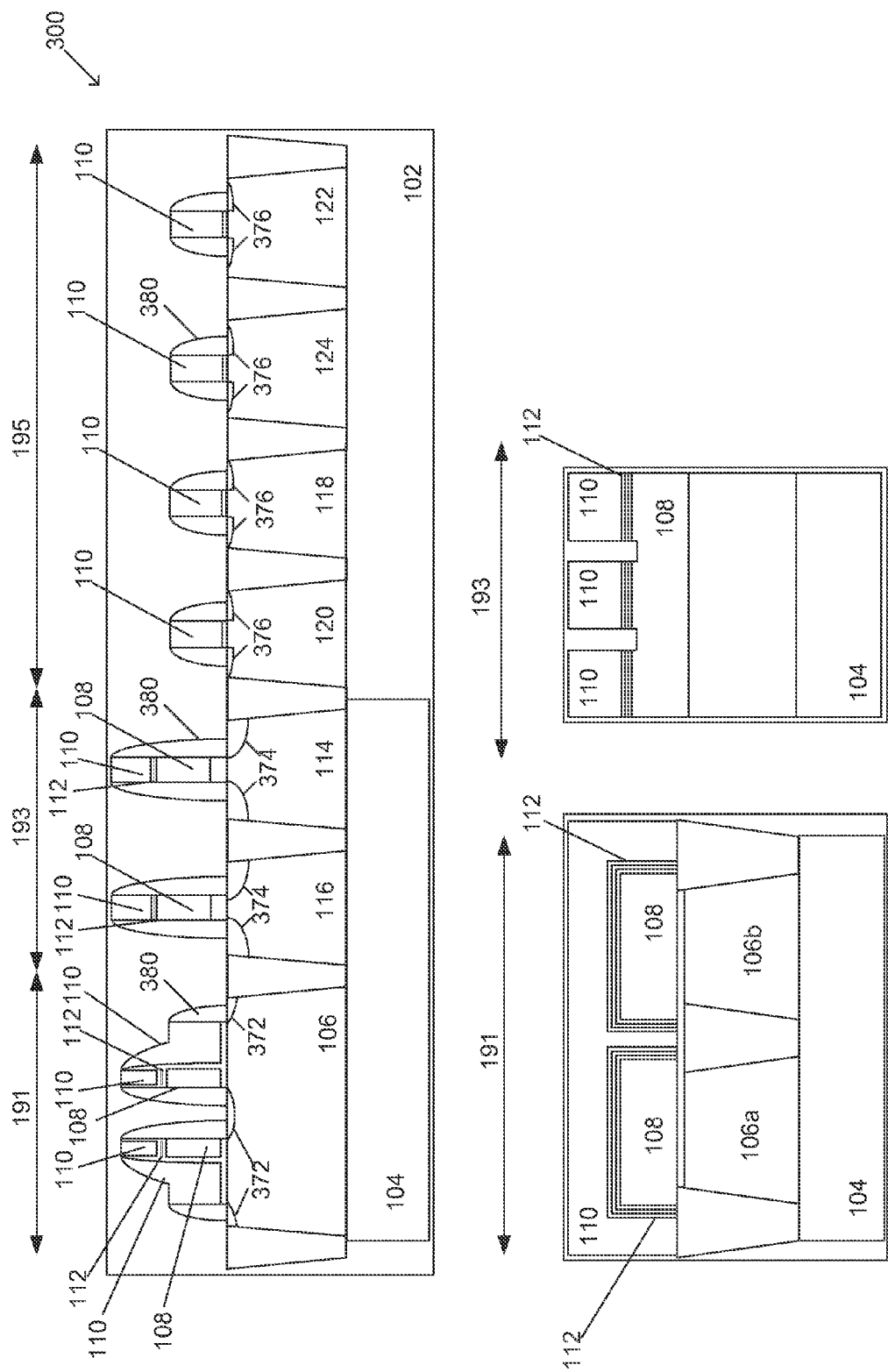
FIG. 14 is a cross-sectional view of a twelfth portion of a manufacturing process of devices for split gate embedded memory technology in accordance with one embodiment of the present disclosure.

As depicted in FIGS. 13-14, example process 300 further includes: removing the hard mask spacers 368 and hard mask layer 360 over the NVM region 191 and high voltage device section 193; performing photolithography and implant processes to form memory and HV light doped diffusion regions 372 and 374 for the NVM section 191 and the HV device section 193, respectively; and performing implant processes to form logic light doped diffusion regions 376 for the logic device section 195, forming spacers 380 over the sidewalls of the NVM, HV and logic gates and forming heavily doped diffusion regions for the memory, HV and logic devices. The diffusion regions may be formed by implantation processes with suitable dose, dopant types and concentrations.

Additional processes may be performed to complete the device. For example, the process 300 may include a silicidation process, for example, for the source/drain during contact hole opening, in addition to conventional back end of line process to finish the manufacturing of the device. Further, interconnect metal levels may be provided to form interconnections to the terminals of the transistor and other circuit components, as desired. Other processes may include, for example, final passivation, dicing and packaging. It is also understood that the process steps as described above may be modified accordingly to produce a desired device.

The split gate embedded memory technology according to the present disclosure includes several advantages. For example, the device and the process as described utilize not three but two polysilicon layers: one for floating gate poly and the other for logic, HV and stack gate and split gate. The ONO process of the manufacturing method results in low reliability risk and good uniformity in the split gate memory devices. Moreover, embodiments of the manufacturing method have good controllability of the profile and critical dimension of select gates in production. Furthermore, there is no need to provide non-volatile memory and high-voltage protection for split gate memory devices manufactured by embodiments of the manufacturing method of the present disclosure.

The present disclosure may be embodied in other specific forms without departing from the spirit or essential characteristics thereof. The foregoing embodiments, therefore, are to be considered in all respects illustrative rather than limiting the present disclosure described herein. Scope of the present disclosure is thus indicated by the appended claims, rather than by the foregoing description, and all changes that come within the meaning and range of equivalency of the claims are intended to be embraced therein.

What is claimed is:

1. A method of manufacturing a device, comprising:
providing a semiconductor substrate having at least a non-volatile memory (NVM) device section and a high-voltage (HV) device section;
forming a deep well region of a first electrical polarity in the substrate;
forming a flash well region of a second electrical polarity over the deep well region in the NVM device section;
forming first and second HV well regions over the deep well region in the HV device section, wherein
the first HV well region is of the first electrical polarity, and
the second HV well region is of the second electrical polarity, the second HV well region is disposed between and spaced apart from the first HV well region and the flash well region;
depositing a first polysilicon layer over the flash well region, the first HV well region, and the second HV well region;
patterning the first polysilicon layer to form first and second floating gates over the flash well region and first and second lower HV gates over the first and second HV well regions;
depositing a second polysilicon layer over the first polysilicon layer; and
patterning the second polysilicon layer to form
first and second control gates and first and second select gates over the flash well region, and
first and second upper HV gates over the first and second lower HV gates.

2. The method of claim 1, further comprising:
forming a logic device section in the substrate; and
processing the logic device section prior to depositing the second polysilicon layer to form
a first input/output (IO) well region of the first electrical polarity,
a second IO well region of the second electrical polarity, the second IO well region disposed between and spaced apart from the first IO well region and the first HV well region,
a first core well region of the first electrical polarity, and
a second core well region of the second electrical polarity, the second core well region disposed between and spaced apart from the first core well region and the first IO well region.

3. The method of claim 2, further comprising:
depositing an oxide-nitride-oxide (ONO) layer and a dummy layer over the first polysilicon layer prior to forming the first and second floating gates;
patterning the dummy layer to form first and second dummy gates over the NVM device section and a dummy layer portion over the HV device section; and
prior to depositing the first polysilicon layer, performing operations including
forming a HV oxidation layer,
providing a tunneling oxide mask and removing a portion of the HV oxidation layer over the flash well region, and
performing a floating gate oxidation process over the flash well region.

4. The method of claim 3 further comprising:
forming a spacer on each side of each of the first and second dummy gates along select gate (SG) direction.

5. The method of claim 4, wherein a width of the spacer on each side of each of the first and second dummy gates is approximately 150 angstroms.

6. The method of claim 3, further comprising:
forming an interpoly oxide spacer on each side of each of the first and second dummy gates along the SG direction;
performing a photolithography and implant process on the IO well regions and the core wells of the logic device section;
performing an etching process on the dummy layer portion and dummy gates;
performing a wet dip operation on the interpoly oxide spacers;
performing a select gate oxide rapid thermal oxidation (RTO) process; and
performing a high-temperature oxidation (HTO) process; and
depositing the second polysilicon layer over the ONO layer.

7. The method of claim 6, wherein the RTO and HTO processes form a select gate oxide having a thickness of approximately 100 angstroms, and wherein the HTO process forms a top oxide layer over the HV device section having a thickness of approximately 50 angstroms.

8. The method of claim 6, further comprising:
prior to depositing the second polysilicon layer, performing operations including
performing IO well masking and oxide etching process;
performing core well masking and oxide etching process; and
performing an oxidation process to form IO and core device gate oxides.

9. The method of claim 6, further comprising:
depositing a hard mask layer over the second polysilicon layer;
performing a HV gate masking and nitride etching process to open HV gate contact areas, removing a portion of the hard mask layer that is over the logic device section, and forming hard mask spacers adjacent a portion of the second polysilicon layer that is over the NVM section; and performing a source line masking process to expose a first portion of the second polysilicon layer between the first and second floating gates and to expose a second portion of the second polysilicon layer over the HV device section.

10. The method of claim 9, further comprising:

performing an etching process on the second polysilicon layer and the ONO layer; and performing a polysilicon conductor photolithography and etching process to partially remove portions of the second polysilicon layer over the NVM section and the HV device section, and to remove portions of the first polysilicon layer over the HV device section.

11. The method of claim 10, further comprising:

removing the hard mask layer;

performing a memory light doped drain and HV light doped drain photolithography and implant process for the NVM section and the HV device section, respectively; and performing a logic light doped drain implant and spacer process for the logic device section.

12. A method of manufacturing a device, comprising:

providing a semiconductor substrate having at least a non-volatile memory (NVM) device section and a high-voltage (HV) device section;

forming a deep well region in the NVM and HV device sections;

forming at least one HV well region over the deep well region in the HV device section;

forming a flash well region over the deep well region in the NVM device section;

forming a HV oxidation layer over the HV device section and a tunneling oxide layer over the flash well region;

depositing a first polysilicon layer on the substrate and over the HV oxidation layer and tunneling oxide layer;

patterning the first polysilicon layer to form at least one floating gate over the flash well region and at least one lower HV gate over the at least one HV well region;

depositing a second polysilicon layer over the first polysilicon layer; and processing the second polysilicon layer to form
at least one control gate over the floating gate and at least one select gate adjacent to the control and floating gates over the NVM device section, and
at least one upper HV gate over the at least one lower HV gate.

13. The method of claim 12 comprising:

depositing an oxide-nitride-oxide (ONO) stack and a dummy layer over the first polysilicon layer;

patterning the ONO stack and dummy layer to form at least one dummy gate over the flash well region, wherein a portion of the ONO stack and dummy layer remain over the HV device section;

forming interpoly oxide (IPO) spacers on each side of the floating and dummy gates; and removing the dummy gate and the patterned dummy layer over the HV device section.

14. The method of claim 13 wherein patterning the first polysilicon layer comprises:

removing portions of the first polysilicon layer over the HV device section not protected by the patterned dummy layer; and removing portions of the first polysilicon layer over the NVM device section not protected by the at least one dummy gate to form the at least one floating gate.

15. The method of claim 13 wherein forming the IPO spacers comprises:

performing a high-temperature oxidation process to form a spacer layer over the substrate; and performing a dry etch to remove horizontal portions of the spacer layer and form the IPO spacers over the flash well region.

16. The method of claim 13 wherein removing the dummy gate and the patterned dummy layer comprises:

performing an etch to remove the at least one dummy gate over the flash well region and the patterned dummy layer over the HV device section, wherein a top oxide layer of the ONO stack is exposed;

performing a wet dip operation on the IPO spacers, wherein the wet dip operation removes the exposed top oxide layer of the ONO stack and exposes an intermediate nitride layer of the ONO stack.

17. The method of claim 16 wherein prior to depositing the second polysilicon layer, performing operations comprising:

a select gate oxide rapid thermal oxidation (RTO) process and a high-temperature oxidation (HTO) process to form a select gate oxide over the substrate, wherein the HTO process also forms a top oxide layer over the exposed intermediate nitride layer to form an ONO stack.

18. The method of claim 12 comprising forming a logic device section in the substrate, wherein the HV oxidation layer and the second polysilicon layer are also formed over the logic device section.

19. The method of claim 18 comprising processing the logic device section prior to depositing the second polysilicon layer, wherein processing the logic device section comprises:

forming at least one input/output (IO) well region in the substrate;

forming at least one core well region in the substrate;

performing IO well masking and oxide etching process;

performing core well masking and oxide etching process; and performing an oxidation process to form a gate oxide layer of the at least one logic gate.

20. The method of claim 18 wherein processing the second polysilicon layer comprises:

forming at least one hard mask spacer adjacent to a portion of the second polysilicon layer over the at least one floating gate;

removing portions of the second polysilicon layer over the NVM and the HV device sections to form the control and select gates and upper HV gate, wherein the hard mask spacer prevents or reduces an over-etch of underlying portions of second polysilicon layer which form the at least one select gate; and removing portions of the second polysilicon layer over the logic device section to form at least one logic gate over the logic device section.

* * * * *